United States Patent
Kamikawa

[19]

[11] Patent Number: 6,121,554

[45] Date of Patent: Sep. 19, 2000

[54] PRINTED WIRING BOARD

[75] Inventor: Yoshinori Kamikawa, Tokyo, Japan

[73] Assignee: Kabushiki Kaisha Toshiba, Kawasaki, Japan

[21] Appl. No.: 08/980,452

[22] Filed: Nov. 28, 1997

[30] Foreign Application Priority Data

Apr. 30, 1997 [JP] Japan ................................. 9-112829

[51] Int. Cl.[7] .............................. H05K 1/16; H05K 7/02; H05K 1/11
[52] U.S. Cl. ..................... 174/260; 174/255; 174/265; 174/266; 361/777; 361/794
[58] Field of Search .................... 174/255, 260, 174/262, 265, 266; 361/767, 783, 790, 792, 794, 795, 772, 774, 777, 780; 257/786, 723, 724, 773; 438/129

[56] References Cited

U.S. PATENT DOCUMENTS

| | | |
|---|---|---|
| 4,016,463 | 4/1977 | Beall et al. . |
| 4,860,088 | 8/1989 | Smith et al. . |
| 5,309,024 | 5/1994 | Hirano ..................................... 257/773 |
| 5,511,306 | 4/1996 | Denton et al. ............................. 29/840 |
| 5,519,580 | 5/1996 | Natarajan et al. ...................... 361/760 |
| 5,708,296 | 1/1998 | Bhansali ................................. 257/698 |

*Primary Examiner*—Hyung-Sub Sough
*Attorney, Agent, or Firm*—Finnegan, Henderson, Farabow, Garrett & Dunner, L.L.P.

[57] ABSTRACT

Connecting pads in pad rows in a signal layer are connected to another signal layer through a plurality of through hole rows each including a plurality of plated through holes that extend through a power source layer. Each of the through hole rows includes a plurality of through holes arranged side by side between each two adjacent pad rows corresponding thereto. These plated through holes each face the space between each two adjacent connecting pads in each corresponding pad row, and are arranged at intervals about twice as long as the intervals between the connecting pads. Each two adjacent through hole rows are located with an offset not smaller than the diameter of each pad in the longitudinal direction of the rows, and the power source layer includes a plurality of clear regions that are cleared of a conductor and penetrated individually by the through holes.

15 Claims, 4 Drawing Sheets

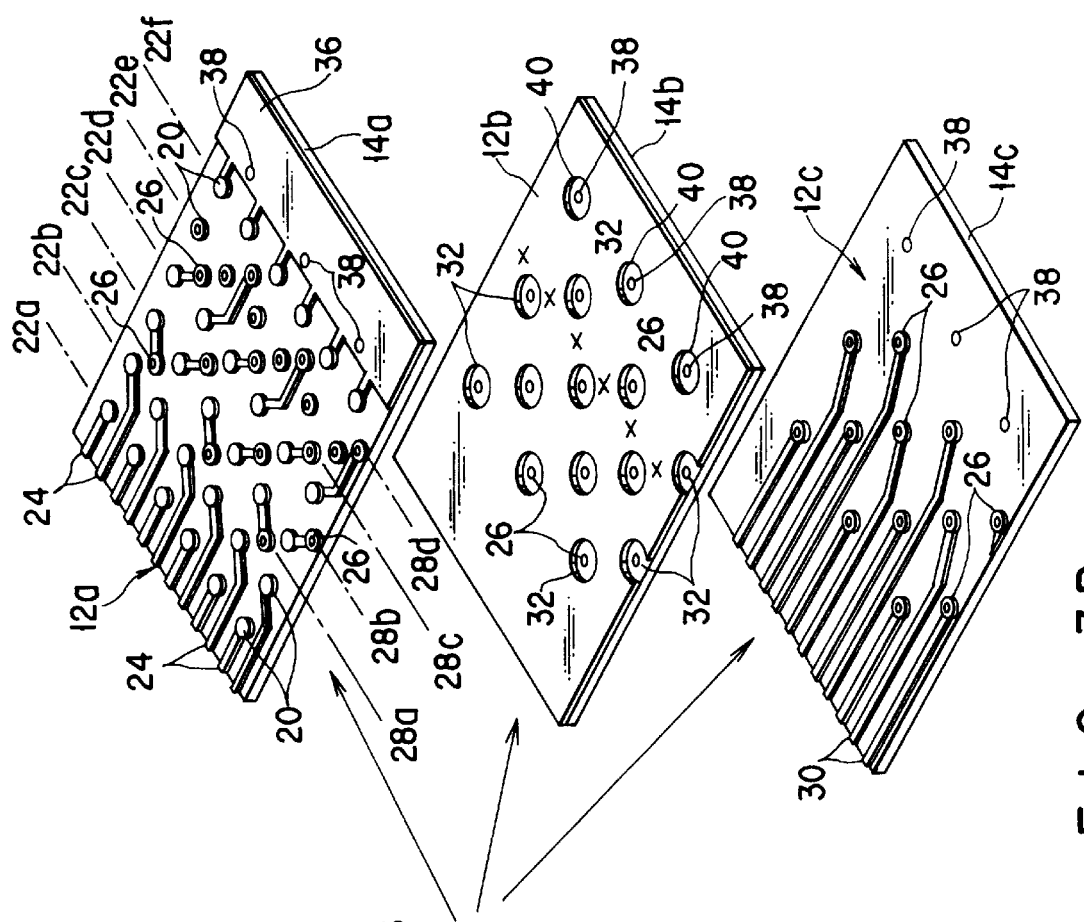
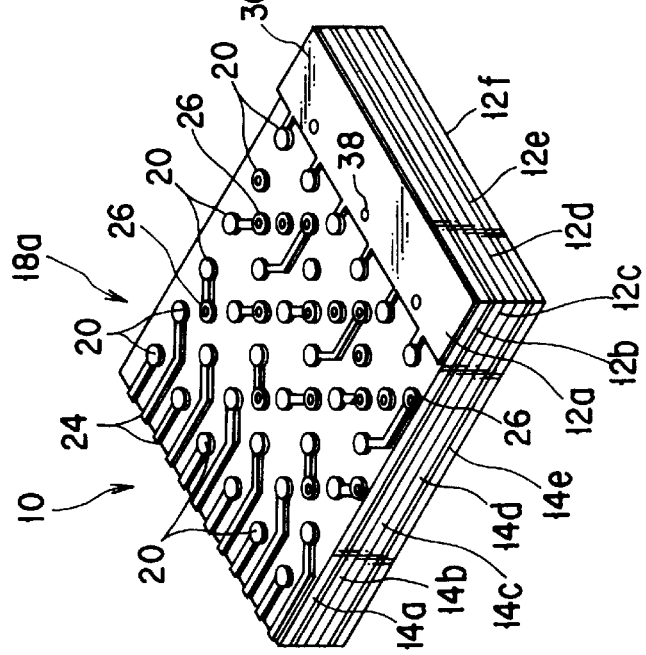
FIG. 3A
FIG. 3B

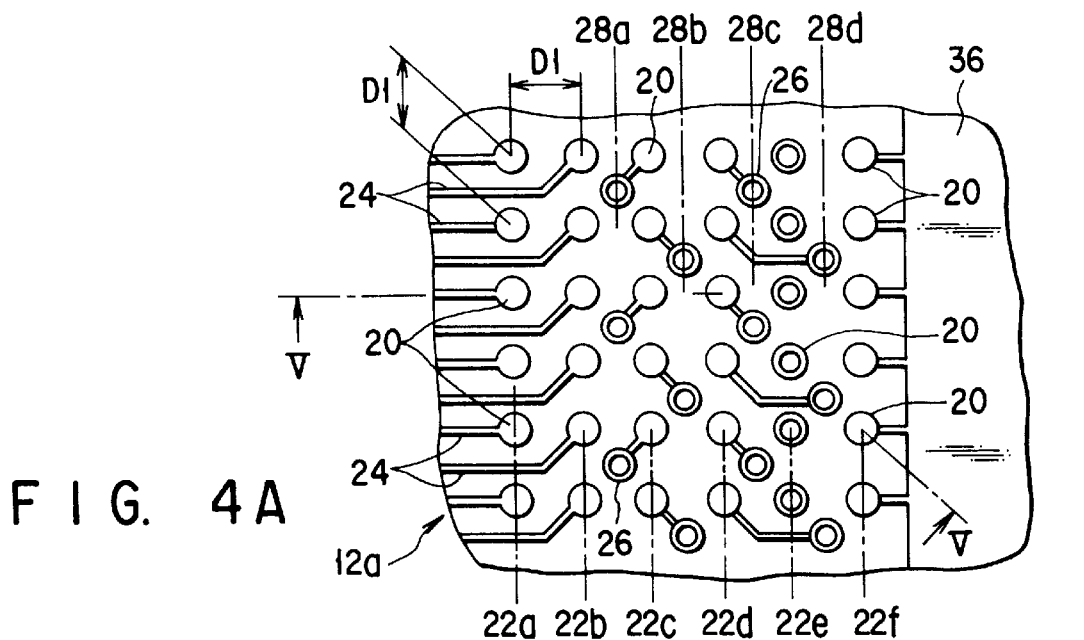
F I G. 4A
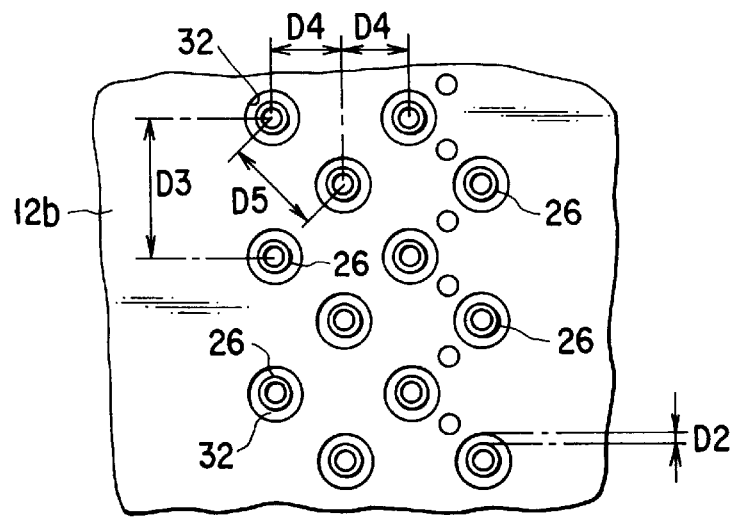
F I G. 4B
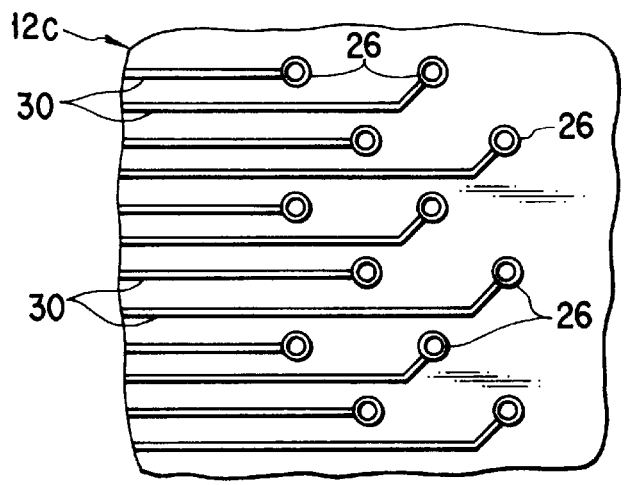
F I G. 4C

PRINTED WIRING BOARD

BACKGROUND OF THE INVENTION

The present invention relates to a printed wiring board, and more particularly, to a multilayer printed wiring board composed of a laminate of conductor layers.

Currently prevailing are double-sided printed wiring boards, multilayer printed wiring boards, etc., which are provided with a plurality of conductor layers such that they can be reduced in size and improved in packing density.

In the printed wiring boards of this type, the conductor layers include, for example, a plurality of signal layers formed by patterning copper leaf and a ground layer or power source layer of solid copper leaf interposed between the signal layers. Insulating layers of polyimide or the like are sandwiched between these conductor layers. At least one of the signal layers is formed having a large number of pads for mounting electronic components.

In the case where the mounted electronic components are semiconductor packages of the ball-grid-array type or chip-size packages that are provided with a large number of electrodes, for example, a large number of connecting pads are formed in close order on mounting regions of each printed wiring board. Due to spatial restrictions, it is difficult to wire these numerous connecting pads by means of one signal layer.

Accordingly, some of the connecting pads are connected to another signal layer through a plurality of plated through holes, and are wired by means of this second signal layer. These through holes extend through an intermediate layer, such as the ground or power source layer, and cause the signal layers to conduct to each other. To avoid conducting to the plated through holes, those portions of the ground or power source layer which surround the through holes are cleared of the copper leaf for a given width.

As the printed wiring boards constructed in this manner are reduced in size and improved in packing density, however, the plated through holes are increased in number, and the intervals between the plated through holes are shortened. Thereupon, the area of those regions of the ground or power source layer from which the copper leaf is removed increases, so that these clear regions sometimes may conduct to one another.

In such a case, the function of the ground or power source layer is too low to ensure satisfactory ground connection or good power supply to the mounted electronic components.

BRIEF SUMMARY OF THE INVENTION

The present invention has been contrived in consideration of these circumstances, and its object is to provide a printed wiring board capable of being reduced in size and improved in packing density without entailing complicated wire arrangement or lowering the reliability of power supply or ground connection.

In order to achieve the above object, a printed wiring board according to an aspect of the present invention comprises a plurality of conductor layers including first and second signal layers and an intermediate layer interposed between the first and second signal layers and constituting a power source layer and/or a ground layer, and insulating layers formed between the adjacent conductor layers.

The first signal layer includes a mounting region composed of a plurality of pad rows arranged at predetermined intervals, each pad row including a large number of connecting pads arranged side by side at regular intervals. The connecting pads in at least one of the pad rows of the mounting region are connected to the second signal layer through a plurality of through hole rows each including a plurality of plated through holes extending through the intermediate layer.

Each of the through hole rows includes a plurality of through holes arranged side by side between each two adjacent pad rows corresponding thereto. The plated through holes in each through hole row each faces the space between each two adjacent connecting pads in each corresponding pad row, and are arranged at intervals about twice as long as the intervals between the connecting pads. Each two adjacent through hole rows on either side of each pad row are located with an offset not smaller than the diameter of each pad in the longitudinal direction of the rows. The intermediate layer includes a plurality of clear regions cleared of a conductor and penetrated individually by the through holes.

In a printed wiring board according to another aspect of the invention, a first signal layer includes a mounting region composed of a plurality of pad rows arranged at predetermined intervals, each pad row including a large number of connecting pads arranged side by side at regular intervals. The connecting pads in first and second pad rows of the mounting region are connected individually to signal wires of the first signal layer, and the connecting pads in third and fourth pad rows are connected to the second signal layer through a plurality of through hole rows each including a plurality of plated through holes extending through the intermediate layer. Each of the through hole rows includes a plurality of through holes arranged side by side between each two adjacent pad rows corresponding thereto. The plated through holes in each through hole row each faces the space between each two adjacent connecting pads in each corresponding pad row, and are arranged at intervals about twice as long as the intervals between the connecting pads. Each two adjacent through hole rows on either side of each pad row are located with an offset not smaller than the diameter of each pad in the longitudinal direction of the rows. The intermediate layer includes a plurality of clear regions cleared of a conductor and penetrated individually by the through holes.

In a printed wiring board according to still another aspect of the invention, a first signal layer includes a mounting region composed of a plurality of pad rows arranged at predetermined intervals, each pad row including a large number of connecting pads arranged side by side at regular intervals. The connecting pads in first and second pad rows of the mounting region are connected individually to signal wires of the first signal layer, and the connecting pads in third and fourth pad rows are connected to the second signal layer through a plurality of through hole rows each including a plurality of plated through holes extending through the intermediate layer. Each of the through hole rows includes a plurality of through holes arranged side by side between each two adjacent pad rows corresponding thereto. The plated through holes in each two adjacent through hole rows on either side of each pad row are arranged in zigzags with respect to the connecting pads in the pad row between the through hole rows. The intermediate layer includes a plurality of clear regions cleared of a conductor and penetrated individually by the through holes.

According to the printed wiring board constructed in this manner, some of the connecting pads in the first signal layer are connected to the second signal layer through the plated through holes. Thus, wires for the connecting pads can be arranged with ease.

Further, the plated through holes are arranged in zigzags, and the interval between each two adjacent through holes is longer than the interval between each two adjacent connecting pads at the least. Accordingly, the clear regions of the intermediate layer between the first and second signal layers can be formed with wide enough spaces between them. Even if the plated through holes are increased in number as the printed wiring board is reduced in size and improved in packing density, therefore, the clear regions of the intermediate layer can never conduct to one another. Thus, the intermediate printed layer can secure a satisfactory area, and at the same time, can be prevented from being divided.

Additional objects and advantages of the invention will be set forth in the description which follows, and in part will be obvious from the description, or may belearned by practice of the invention. The objects and advantages of the invention may be realized and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIGS. 1 to 5 show a printed wiring board according to an embodiment of the present invention, in which:

FIG. 1 is a perspective view showing the printed wiring board and an electronic component;

FIG. 2 is an enlarged plan view showing a mounting region of the printed wiring board;

FIG. 3A is an enlarged perspective view of a portion A of FIG. 2;

FIG. 3B is an exploded perspective view showing a part of the enlarged portion A;

FIGS. 4A to 4C are plan views individually showing a plurality of conductor layers of the printed wiring board in an disassembled state; and FIG. 5 is a sectional view taken along line V—V of FIG. 4A.

DETAILED DESCRIPTION OF THE INVENTION

A printed wiring board according to an embodiment of the present invention will now be described in detail with reference to the accompanying drawings.

Figure 1:
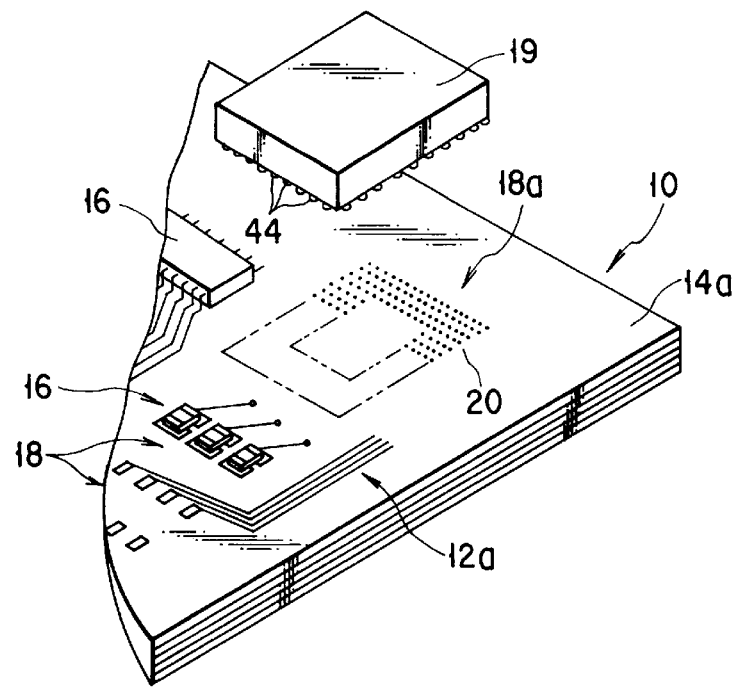

As shown in FIG. 1, a printed wiring board 10 has a signal layer 12a on its upper surface. The layer 12a includes a large number of mounting regions 18 for individually mounting electronic components 16. The wiring board 10 is formed as a multilayer printed base that includes a plurality of conductor layers and insulating layers between them. More specifically, the printed wiring board 10 comprises six conductor layers 12a to 12f formed of copper leaf and five insulating layers 14a to 14e of, e.g., polyimide that are formed individually between the adjacent conductor layers, as shown in FIGS. 1, 3A, 3B and 5.

The first conductor layer 12a, which is exposed in the upper surface of the printed wiring board 10, and the third conductor layer 12c are patterned into specified shapes and constitute signal layers (first and second signal layers), individually. The second conductor layer 12b, which serves as an intermediate layer between the signal layers 12a and 12c, is solid substantially throughout the surface and constitutes a power source layer.

The remaining conductor layers 12d to 12f are formed in symmetrical relation to the first to third layers 12a to 12c. The sixth conductor layer 12f, which is exposed in the lower surface of the printed wiring board 10, and the fourth conductor layer 12d are patterned into specified shapes and constitute signal layers, individually. The fifth conductor layer 12e, which serves as an intermediate layer between the signal layers 12f and 12d, is solid substantially throughout the surface and constitutes a ground layer.

Figure 2:
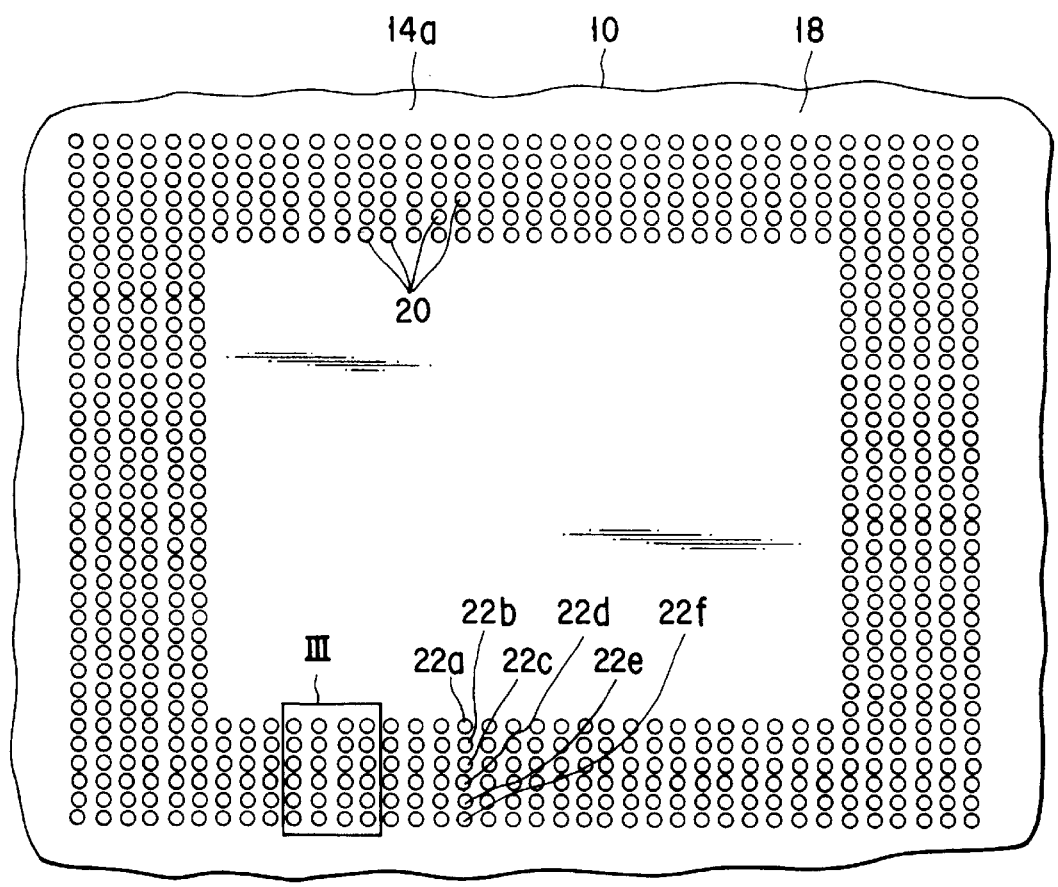

Out of the mounting regions 18 of the signal layer 12a of the printed wiring board 10, as shown in FIGS. 1 and 2, a mounting region 18a on which a semiconductor package 19 of the ball-grid-array (hereinafter referred to as BGA) type, for example, is mounted includes a large number of substantially circular connecting pads 20. These connecting pads are arranged in six rows in a rectangular frame.

As shown in FIGS. 2, 3A, 3B, 4A, 4B and 4C, the connecting pads 20 are arranged at regular intervals in a matrix. More specifically, the pads 20 are arranged side by side in first to sixth parallel pad rows 22a to 22f. In each pad row, the connecting pads 20 are arranged at predetermined pitches or at regular intervals D1 in a straight line. The first to sixth pad rows are also arranged parallel to one another at the regular intervals D1, which are adjusted to, for example, 0.5 mm to 1.3 mm each.

As shown in FIGS. 3A, 3B and 4A, the connecting pads 20 in the first pad row 22a in the outermost position and the connecting pads 20 in the second pad row 22b are connected individually to wires 24 of the signal layer 12a.

First, second, third, and fourth through hole rows 28a, 28b, 28c and 28d, including a plurality of plated through holes 26 each, are arranged between the second and third pad rows 22b and 22c, between third and fourth pad rows 22c and 22d, between the fourth and fifth pad rows 22d and 22e, and between the fifth and sixth pad rows 22e and 22f, respectively.

As shown in FIGS. 3A, 3B, 4A, 4B, 4C and 5, the plated through holes 26 extend from the signal layer 12a to the signal layer 12c through the insulating layer 14a, power source layer 12b, and insulating layer 14b. The respective first ends of the through holes 26 are connected individually to the connecting pads 20 in the third and fourth pad rows 22c and 22d, out of the connecting pads 20 of the signal layer 12a. The respective other ends of the through holes 26 are connected individually to a plurality of wires 30 of the signal layer 12c. Thus, the connecting pads 20 in the third and fourth pad rows 22c and 22d are connected electrically to the signal layer 12c through their corresponding plated through holes 26.

Those portions of the power source layer 12b which are penetrated by the plated through holes 26 are cleared of the copper leaf, thereby forming circular clear regions 32. Thus, the through holes 26 extend without conducting to the power source layer 12b. As shown in FIG. 4B, each clear region 32 is formed concentrically with its corresponding through hole 26, and there is a space D2 of 0.1 mm to 0.25 mm between the peripheral edge of each clear region and its corresponding through hole.

As shown in FIGS. 3A, 3B, 4A, 4B and 4C, the plated through holes 26 in each of the first to fourth through hole rows 28a to 28d are arranged at regular intervals D3 in a straight line. Each interval D3 is about twice as long as each interval D1 between the connecting pads 20. Further, an interval D4 between each two adjacent through hole rows is equal to the interval D1 between each two adjacent connecting pads 20. The through holes 26 in each through hole row and the connecting pads 20 in the adjacent pad row are arranged with offsets in the longitudinal direction of the rows. Thus, each plated through hole 26 is opposed to the space between its corresponding two adjacent connecting pads 20 in the adjacent pad row.

Moreover, the plated through holes 26 in the first and second through hole rows 28a and 28b on either side of the third pad rows 22c are arranged with offsets corresponding to the diameter of each pad in the longitudinal direction of the rows. Thus, the through holes 26 in the first and second through hole rows 28a and 28b are arranged in zigzags with respect to the connecting pads 20 in the third pad row 22c. Every other connecting pad 20 in the third pad row 22c is connected to one of the plated through holes 26 in the first or second through hole row 28a or 28b.

An interval D5 between each plated through hole 26 in the first through hole row 28a and its corresponding plated through hole 26 in the second through hole row 28b is adjusted to D1×√2.

Likewise, the plated through holes 26 in the third and fourth through hole rows 28c and 28d on either side of the fifth pad rows 22e are arranged with offsets corresponding to the diameter of each pad in the longitudinal direction of the rows. At the same time, the through holes 26 in the third and second through hole rows 28c and 28b are arranged with offsets corresponding to the diameter of each pad in the longitudinal direction of the rows. Thus, the through holes 26 in the third and fourth through hole rows 28c and 28d are arranged in zigzags with respect to the connecting pads 20 in the fifth pad row 22e, and the through holes 26 in the second and third through hole rows 28b and 28c are arranged in zigzags with respect to the connecting pads 20 in the fourth pad row 22d.

Every other connecting pad 20 in the fourth pad row 22d is connected to one of the plated through holes 26 in the third or fourth through hole row 28c or 28d.

Figure 5:
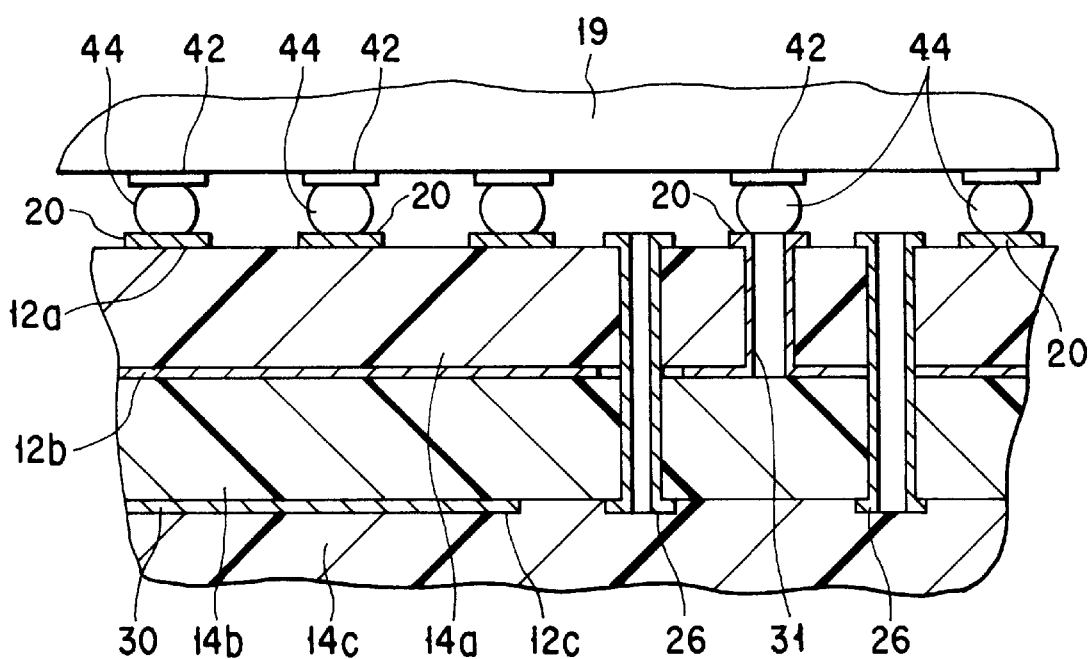

As shown in FIGS. 4A and 5, on the other hand, each connecting pad 20 in the fifth pad row 22e is formed of one end portion of one of plated through holes 31. The through holes 31 penetrates the insulating layer 14a and conducts to the power source layer 12b. Thus, the connecting pads 20 in the fifth pad row 22e is connected to the power source layer 12b through the plated through holes 31, individually.

As shown in FIGS. 3A, 3B, 4A, 4B and 4C, the signal layer 12a includes a common electrode 36 that causes the connecting pads 20 in the sixth pad row 22f to conduct to one another. The electrode 36 is connected to the ground layer 12d through three plated through holes 38. Each through hole 38 extends penetrating the insulating layer 14a, power source layer 12b, and insulating layers 14b, 14c and 14d. Those portions of the power source layer 12b which are penetrated by the plated through holes 38 are cleared of the copper leaf, thereby forming circular clear regions 40. Thus, the through holes 38 extend without conducting to the power source layer 12b.

As shown in FIGS. 1 and 5, the BGA semiconductor package 19 to be mounted on the mounting region 18a of the printed wiring board 10 constructed in this manner includes a large number of electrodes 42 formed on its lower surface and solder balls 44 fixed individually on the electrodes. The package 19 is mounted on the wiring board 10 in a manner such that the solder balls 44 are soldered to their corresponding connecting pads 20.

According to the printed wiring board constructed in this manner, the connecting pads 20 in the third and fourth pad rows 22c and 22d, among the other connecting pads in the mounting region 18a of the signal layer 12a, are connected to the signal layer 12c through the plated through holes 26. Thus, wires for the connecting pads can be arranged with ease.

Further, the plated through holes 26 are arranged in zigzags, and the interval between each two adjacent through holes 26 is adjusted to D1×√2, which is greater than the interval D1 between each two adjacent connecting pads 20, at the least. Thus, the clear regions 32 of the power source layer 12b between the signal layers 12a and 12c can be formed with wide enough spaces between them. Even if the plated through holes are increased in number as the printed wiring board is reduced in size and improved in packing density, therefore, the clear regions 32 of the power source layer 12b can never conduct to one another. Accordingly, the power source layer can secure a satisfactory area, and at the same time, can be prevented from being divided. In consequence, power can be supplied with high reliability.

It is to be understood that the present invention is not limited to the embodiment described above, and that various changes and modifications may be effected therein by one skilled in the art without departing from the scope or spirit of the invention. For example, the intermediate layer interposed between the two signal layers is not limited to the power source layer, and may alternatively be a ground layer. In this case, as in the case of the foregoing embodiment, the ground layer can secure a satisfactory area, and can be prevented from being divided. Thus, ground connection can be stabilized.

The intermediate layer is not limited to one power source layer, and may be composed of a plurality of conductor layers including power source layers and ground layers. Further, the mounted electronic components are not limited to BGA semiconductor packages, and may alternatively be chip-size packages having a large number of electrodes, bare chips, etc.

Although the mounting region is provided with six pad rows and four through hole rows according to the embodiment described herein, the effects of the present invention can be obtained with use of a mounting region that is only provided with at least two through hole rows.

Additional advantages and modifications will readily occur to those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

What is claimed is:

1. A printed wiring board comprising:
   a plurality of conductor layers including a first signal layer, a second signal layer and an intermediate layer, wherein said intermediate layer is interposed between the first and second signal layers and comprises one of a power source layer and a ground layer; and
   insulating layers formed between adjacent conductor layers,
   the first signal layer including a mounting region comprising a plurality of pad rows arranged at predetermined intervals, each pad row including a plurality of connecting pads arranged side by side along said pad row at regular intervals such that a space is formed between adjacent connecting pads,
   the connecting pads in at least one of the pad rows of the mounting region being connected to the second signal layer through a plurality of through hole rows, wherein each of said through hole rows includes a plurality of plated through holes extending through the intermediate layer, each of said plurality of through hole rows being arranged between a corresponding pair of adjacent pad rows, wherein each of said plurality of plated through holes is disposed opposite to said space formed between adjacent connecting pads in each corresponding pad row, and said plurality of plated through holes are arranged along each of said through hole rows at intervals about twice as long as the intervals between the connecting pads, each of two adjacent through hole rows on either side of each pad row being located offset from one another in the longitudinal direction of the through hole rows by a distance of at least a diameter of each connecting pad, and the intermediate layer including a plurality of clear regions cleared of a conductor and penetrated individually by the plated through holes.

2. A printed wiring board according to claim 1, wherein each of said regular intervals between said adjacent connecting pads in each of said pad rows is equal to each of said predetermined intervals between said adjacent pad rows.

3. A printed wiring board according to claim 1, wherein each said clear region of said intermediate layer is substantially circular in shape, and each said plated through hole is concentric with each corresponding clear region.

4. A printed wiring board according to claim 1, wherein an interval between a plated through hole of a first through hole row and a corresponding plated through hole of an adjacent through hole row is adjusted to at least $D \times \sqrt{2}$, where D is a measure of each of said regular intervals between said adjacent connecting pads along each of said pad rows.

5. A printed wiring board comprising:

a plurality of conductor layers including a first signal layer, a second signal layer and an intermediate layer, wherein said intermediate layer is interposed between the first and second signal layers and comprises one of a power source layer and a ground layer; and insulating layers formed between adjacent conductor layers, the first signal layer including a mounting region comprising a plurality of pad rows arranged at predetermined intervals, each pad row including a plurality of connecting pads arranged side by side along said pad row at regular intervals such that a space is formed between adjacent connecting pads, the connecting pads in first and second pad rows of the mounting region being connected individually to signal wires of the first signal layer and the connecting pads in third and fourth pad rows being connected to the second signal layer through a plurality of through hole rows each including a plurality of plated through holes extending through the intermediate layer, each of said plurality of through hole rows being arranged between a corresponding pair of adjacent pad rows, wherein each of said plurality of plated through holes is disposed opposite to said space formed between adjacent connecting pads in each corresponding pad row, and said plurality of plated through holes are arranged along each of said through hole rows at intervals about twice as long as the intervals between the connecting pads, each of two adjacent through hole rows on either side of each pad row being located offset from one another in the longitudinal direction of the through hole rows by a distance of at least a diameter of each connecting pad, and the intermediate layer including a plurality of clear regions cleared of a conductor and penetrated individually by the plated through holes.

6. A printed wiring board according to claim 5, wherein said plurality of through hole rows includes first and second through hole rows arranged on either side of the third pad row, and every other connecting pad in said third pad row is connected to one of the plated through holes in the first or second through hole row.

7. A printed wiring board according to claim 5, wherein each of said regular intervals between said adjacent connecting pads in each of said pad rows is equal to each of said predetermined intervals between said adjacent pad rows.

8. A printed wiring board according to claim 5, wherein each said clear region of said intermediate layer is substantially circular in shape, and each said plated through hole is concentric with each corresponding clear region.

9. A printed wiring board according to claim 5, wherein an interval between a plated through hole of a first through hole row and a corresponding plated through hole of an adjacent through hole row is adjusted to at least $D \times \sqrt{2}$, where D is a measure of each of said regular intervals between said adjacent connecting pads along each of said pad rows.

10. A printed wiring board comprising:

a plurality of conductor layers including a first signal layer, a second signal layer and an intermediate layer, wherein said intermediate layer is interposed between the first and second signal layers and comprises one of a power source layer and a ground layer; and insulating layers formed between the adjacent conductor layers, the first signal layer including a mounting region comprising a plurality of pad rows arranged at predetermined intervals, each pad row including a plurality of connecting pads arranged side by side along said pad row at regular intervals, the connecting pads in first and second pad rows of the mounting region being connected individually to signal wires of the first signal layer and the connecting pads in third and fourth pad rows being connected to the second signal layer through a plurality of through hole rows each including a plurality of plated through holes extending through the intermediate layer, wherein each of said plurality of through hole rows is arranged between a corresponding pair of adjacent pad rows, the plated through holes in two adjacent through hole rows on either side of each pad row are arranged in zigzags with respect to the connecting pads in the pad row between the two adjacent through hole rows, and the intermediate layer includes a plurality of clear regions cleared of a conductor and penetrated individually by the plated through holes.

11. A printed wiring board according to claim 10, wherein said plurality of through hole rows includes first and second through hole rows arranged on either side of the third pad row, and every other connecting pad in said third pad row is connected to one of the plated through holes in the first or second through hole row.

12. A printed wiring board according to claim 10, wherein each of said regular intervals between said adjacent connecting pads in each of said pad rows is equal to each of said predetermined intervals between said adjacent pad rows.

13. A printed wiring board according to claim 10, wherein each said clear region of said intermediate layer is substantially circular in shape, and each said plated through hole is concentric with each corresponding clear region.

14. A printed wiring board according to claim 10, wherein an interval between a plated through hole of a first through hole row and a corresponding plated through hole of an adjacent through hole row is adjusted to at least $D \times \sqrt{2}$, where D is a measure of each of said regular intervals between said adjacent connecting pads along each of said pad rows.

15. A printed wiring board comprising:
a plurality of conductor layers including a first signal layer, a second signal layer and an intermediate layer, wherein said intermediate layer is interposed between the first and second signal layers and comprises one of a power source layer and a ground layer; and
insulating layers formed between adjacent conductor layers;
the first signal layer including a mounting region on which a single electronic element is to be mounted, the mounting region comprising a plurality of pad rows arranged at predetermined intervals, each pad row including a plurality of connecting pads for the electronic element, which are arranged side by side along said pad row at regular intervals such that a space is formed between adjacent connecting pads,
the connecting pads in at least one of the pad rows of the mounting region being connected to the second signal layer through a plurality of through hole rows, wherein each of said through hole rows includes a plurality of plated through holes extending through the intermediate layer,
each of said plurality of through hole rows being arranged between a corresponding pair of adjacent pad rows,
wherein each of said plurality of plated through holes is disposed opposite to said space formed between adjacent connecting pads in each corresponding pad row, and said plurality of plated through holes are arranged along each of said through hole rows at intervals about twice as long as the intervals between the connecting pads,
each of two adjacent through hole rows on either side of each pad row being located offset from one another in the longitudinal direction of the through hole rows by a distance of at least a diameter of each connecting pad, and
the intermediate layer including a plurality of clear regions cleared of a conductor and penetrated individually by the plated through holes.

* * * * *